(12) United States Patent
Gibney et al.

(10) Patent No.: US 10,340,916 B1
(45) Date of Patent: Jul. 2, 2019

(54) USING ISLANDS TO CONTROL OPERATING PARAMETERS FOR FUNCTIONAL BLOCKS IN AN ELECTRONIC DEVICE

(71) Applicant: Advanced Micro Devices, Inc., Santa Clara, CA (US)

(72) Inventors: Thomas J. Gibney, Newton, MA (US); Sridhar V. Gada, Banglore (IN); Alexander J. Branover, Chesnut Hill, MA (US); Benjamin Tsien, Fremont, CA (US)

(73) Assignee: ADVANCED MICRO DEVICES, INC., Santa Clara, CA (US)

( * ) Notice: Subject to any disclaimer, the term of this patent is extended or adjusted under 35 U.S.C. 154(b) by 0 days.

(21) Appl. No.: 15/859,124

(22) Filed: Dec. 29, 2017

(51) Int. Cl.
  *G06F 17/50* (2006.01)
  *H03K 19/0175* (2006.01)
  *H03K 19/173* (2006.01)

(52) U.S. Cl.
  CPC . *H03K 19/017509* (2013.01); *H03K 19/1733* (2013.01)

(58) Field of Classification Search
  CPC .................. H03K 19/017509; H03K 19/1733
  See application file for complete search history.

(56) References Cited

U.S. PATENT DOCUMENTS

| | | | | |
|---|---|---|---|---|
| 7,111,178 B2* | 9/2006 | Rusu | ..................... | G06F 1/3203 700/32 |
| 7,945,885 B2* | 5/2011 | Hoberman | ............ | G06F 1/3203 716/133 |
| 2003/0110012 A1* | 6/2003 | Orenstien | ............... | G06F 1/206 702/188 |
| 2009/0235108 A1* | 9/2009 | Gold | ....................... | G06F 1/206 713/500 |
| 2013/0246820 A1* | 9/2013 | Branover | .............. | G06F 1/3296 713/320 |
| 2014/0181556 A1* | 6/2014 | Eckert | ..................... | G06F 1/324 713/323 |
| 2014/0210097 A1* | 7/2014 | Chen | ....................... | H01L 21/50 257/774 |
| 2016/0011645 A1* | 1/2016 | Min | ...................... | G06F 1/3237 713/322 |

* cited by examiner

*Primary Examiner* — Alexander H Taningco
*Assistant Examiner* — Kurtis R Bahr
(74) *Attorney, Agent, or Firm* — Park, Vaughan, Fleming & Dowler LLP

(57) ABSTRACT

An electronic device includes a plurality of hardware functional blocks, the hardware functional blocks being logically grouped into two or more islands, with each island including a different one or more of the hardware functional blocks. A hardware controller in the electronic device is configured to determine a present activity being performed by at least one of the hardware functional blocks. The hardware controller then, based on the present activity, configures supply voltages for the hardware functional blocks in some or all of the islands.

14 Claims, 4 Drawing Sheets

USING ISLANDS TO CONTROL OPERATING PARAMETERS FOR FUNCTIONAL BLOCKS IN AN ELECTRONIC DEVICE

BACKGROUND

Related Art

Some electronic devices include functional blocks that have different requirements for operating parameters such as supply voltage, current, clock frequency, temperature, etc. For example, a memory functional block may include memory circuit elements that require a supply voltage above a threshold voltage (e.g., 0.7 V) to operate reliably (i.e., to retain stored values, return correct values, etc.), while a communication fabric functional block may include circuits that are designed to operate at a lower supply voltage, such as a particularly low "sub-Vmin voltage" (e.g., 0.3 V). Because functional blocks have different operating parameter requirements, some functional blocks may not operate optimally when the operating parameter limits of other functional blocks are used to define their operating parameters. For example, the above-described communication fabric functional block and the memory functional block may both be provided with a supply voltage that is sufficiently high to enable the both functional blocks to operate, i.e., the voltage above the threshold voltage that enables the memory functional block to operate. Configuring the supply voltages in this way, however, results in unnecessarily high supply voltage and thus inefficient operation for the communication fabric subsystem. In other words, the communication fabric subsystem may be held at the voltage above the threshold voltage in order to enable the memory functional block at times when the communication fabric could otherwise be operated at the sub-Vmin voltage. The problem of different operating parameters and the configuration of operating parameters for functional blocks is particularly pronounced in electronic devices in which functional blocks or functional block designs (e.g., macros, IPs, etc.) from multiple different designers are incorporated into a single electronic device.

BRIEF DESCRIPTION OF THE FIGURES

Throughout the figures and the description, like reference numerals refer to the same figure elements.

DETAILED DESCRIPTION

Figure 1:
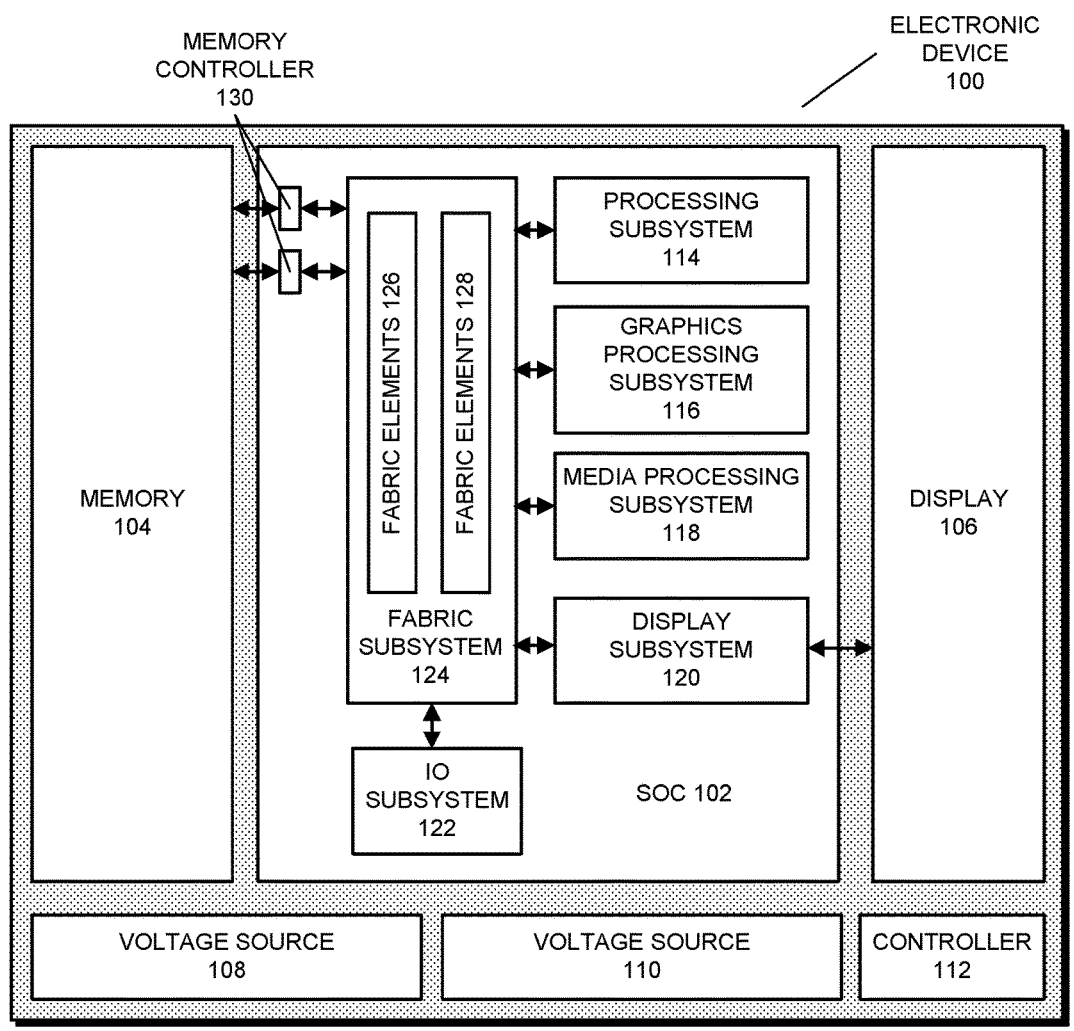
FIG. 1 presents a block diagram illustrating an electronic device in accordance with some embodiments.

The following description is presented to enable any person skilled in the art to make and use the described embodiments, and is provided in the context of a particular application and its requirements. Various modifications to the described embodiments will be readily apparent to those skilled in the art, and the general principles defined herein may be applied to other embodiments and applications. Thus, the described embodiments are not limited to the embodiments shown, but are to be accorded the widest scope consistent with the principles and features disclosed herein.

Terminology

In the following description, various terms are used for describing embodiments. The following is a simplified and general description of one of these terms. Note that the term may have significant additional aspects that are not recited herein for clarity and brevity and thus the description is not intended to limit the term.

Functional block: "functional block" as used herein refers to a group, collection, and/or set of one or more interrelated circuit elements such as integrated circuits, discrete circuit elements, etc. The circuit elements are "interrelated" in that circuit elements share at least one property. For instance, the interrelated circuit elements may be included in, fabricated on, or otherwise coupled to a particular integrated circuit chip or sub-block/portion thereof, may be involved in the performance of given functions (computational functions, memory functions, etc.), may be controlled by a common control element, may share one or more operating parameters or operating parameter thresholds (supply voltages, clock frequencies, etc.), etc. For example, a functional block may include a set of circuit elements that perform media processing operations, such as a media processing subsystem in an electronic device. As another example, a functional block may include a processing pipeline, a compute unit, or dedicated processing circuits in a processing subsystem of an electronic device. Note that, for the latter example, at least some circuit elements in the processing subsystem—i.e., circuit elements outside the processing pipeline, etc.—are not included in the indicated functional block. A functional block can include any number of circuit elements, such as a single circuit element (e.g., a single integrated circuit logic gate), millions of circuit elements (e.g., an integrated circuit memory), etc. A "hardware" functional block includes hardware circuit elements such as integrated circuits and discrete circuit elements—which may be dedicated or purpose-specific hardware circuit elements—that are arranged to perform corresponding functions.

Overview

The described embodiments include an electronic device that includes one or more hardware functional blocks such as processing subsystems, communication fabric subsystems, display subsystems, etc. In the described embodiments, the functional blocks are logically grouped into two or more islands, with each island including a different one or more of the functional blocks. For example, in an embodiment with three functional blocks, one of the functional blocks may be included in a first island and the other two functional blocks may be included in a second island. A hardware controller in the electronic device determines a present activity being performed by some or all of the functional blocks and, based on the present activity, configures operating parameters (e.g., supply voltages, clock frequencies, etc.) for the functional blocks in one or more of the islands. For example, the controller may, using one or more operational indicators (e.g., instruction execution rate, bandwidth consumption, software load, etc.), determine that a particular type of activity is (or is not) being performed by a given functional block. The controller may then, based on the type of activity, configure the operating parameters for some or all of the functional blocks in the two or more islands.

In some embodiments, some or all of the functional blocks in the electronic device have different operating parameter requirements. For example, a first functional block may be implemented using circuit elements that are designed to operate in a range of supply voltages that includes a particularly low "sub-Vmin voltage." In these embodiments, a second functional block is implemented using circuit elements that are not designed to—and will therefore not—operate, or at least operate reliably, at the sub-Vmin voltage. In other words, some or all of the circuit elements (e.g., memory circuit elements, logic, etc.) in the second functional block are to be provided a supply voltage that is higher than the sub-Vmin voltage in order to be assured of reliable operation. In some embodiments, the functional blocks are logically grouped into the above-described two or more islands based at least in part on their respective operating parameter requirements. Continuing the example, this would mean that the functional blocks are logically grouped into islands based on which functional blocks are (and are not) operable at the sub-Vmin voltage. In these embodiments, only functional blocks in islands that support certain operating parameter values (e.g., the sub-Vmin voltage) have their operating parameters so configured. The operating parameters for functional blocks in other islands are configured at other operating parameter values—e.g., to voltages above corresponding threshold voltages.

By logically grouping functional blocks into islands and configuring the operating parameters for functional blocks in the islands based on the present activity as described, the described embodiments are able to better tailor the operating parameters for the functional blocks in each island. This can, in turn, result in the more efficient use of electrical power, lower temperatures, better throughput, etc. in the electronic device, which leads to improved battery lifetime, better electronic device function and longevity, and increased user satisfaction with the electronic device.

System

FIG. 1 presents a block diagram illustrating an electronic device 100 in accordance with some embodiments. As can be seen in FIG. 1, electronic device 100 includes system on a chip ("SOC") 102, memory 104, display 106, voltage sources 108 and 110, and controller 112. SOC 102 includes processing subsystem 114, graphics processing subsystem 116, media processing subsystem 118, display subsystem 120, input/output ("IO") subsystem 122, and fabric subsystem 124.

SOC 102 is a general-purpose computing device that is implemented on a single integrated circuit chip. SOC 102 (which can be considered itself, as a whole, as a more complex hardware functional block) includes various hardware functional blocks that enable SOC 102 to perform many of the functions previously associated with "fully featured" computing devices, such as general computational processing, graphics processing, media processing, etc., without requiring corresponding separate/additional integrated circuit chips and/or circuit elements.

Processing subsystem 114 in SOC 102 is a hardware functional block that is configured to perform general computational processing operations such as instruction execution, control operations, event handling operations, and/or other operations. For example, processing subsystem 114 may include one or more central processing units (CPUs) or CPU cores, application-specific integrated circuits (ASICs), microcontrollers, and/or programmable-logic devices.

Graphics processing subsystem 116 in SOC 102 is a hardware functional block that is configured to perform processing operations for graphics processing, such as rendering, shading, rasterization, etc. For example, graphics processing subsystem 116 may include one or more graphics processing units (GPU) or GPU cores. In some embodiments, graphics processing subsystem 116 includes processing circuits, such as compute units, that can be used for performing general-purpose computational operations, such as offloading specified types of computational work (e.g., matrix processing, vector processing, etc.) from processing subsystem 114.

Media processing subsystem 118 in SOC 102 is a hardware functional block that is configured to process audio and/or visual media for output via one or more speakers coupled to electronic device 100, for display on display 106, and/or for another form of presentation (e.g., haptic, etc.). For example, media processing subsystem 118 may decode audio and/or video, render information for presentation, and/or perform other media processing functions.

Display subsystem 120 in SOC 102 is a hardware functional block that is configured to perform operations for displaying images on display 106, such as frame buffering and organizing, rendering, handling requests from display 106 and other functional blocks in SOC 102, etc. In some embodiments, display subsystem 120 can operate in a "static display" mode, during which display subsystem 120 periodically acquires, from memory 104 (or elsewhere), information for display on display 106 (i.e., a screen image or images to be displayed) that is provided to display 106. Display 106 internally buffers/stores the information and then uses the buffered/stored information to repeatedly drive a static image (or images) to a screen in display 106 for a specified amount of time. After the specified amount of time has passed, display subsystem 120 again acquires (possibly new) information from memory 104 and provides the information to display 106 for display in a similar way. In these embodiments, when not acquiring and providing the information, display subsystem 120 can operate in a low power mode. In some embodiments, display subsystem 120 is included in an island that is configured in the low power mode during idle portions of the static display mode, as described below.

Input-output ("IO") subsystem 122 in SOC 102 is a hardware functional block that is configured to perform input-output operations for interfacing between SOC 102 and peripherals such as keyboards, microphones, data collection devices, sensors, etc. In some embodiments, IO subsystem 122 also performs operations for handling communications between functional blocks in SOC 102 and one or more wired and/or wireless network subsystems (e.g., Bluetooth, cellular, universal serial bus (USB), Wi-Fi, etc.).

Fabric subsystem 124 in SOC 102, which is interchangeably called "communication fabric subsystem" herein, is a hardware functional block that is configured to perform operations for routing communications between the various other functional blocks in SOC 102. Fabric subsystem 124 includes circuit elements such as switches, routers, and/or other circuit elements for directing and routing communications (packets, messages, data units, etc.) between the other functional blocks. As can be seen in FIG. 1, in some embodiments, fabric subsystem 124 includes fabric elements 126-128, each of which includes a different subset of the above-described circuit elements in fabric subsystem 124. In some of these embodiments, fabric elements 126-128 may be included in separate islands for configuring supply voltages.

Memory controllers 130 in SOC 102 are hardware functional blocks that are configured to interface, at the circuit device or physical level, between SOC 102 and memory 104. Memory controllers 130 perform operations for managing the exchange of data between SOC 102 and memory 104, such as performing reads, writes, and/or other data accesses in memory 104, may perform configuration and control operations for memory circuits in memory 104 (e.g., control data refreshes for dynamic memory devices, etc.), etc.

Memory 104 in electronic device 100 is a hardware functional block that is configured to store data and/or instructions for access by SOC 102 (i.e., the subsystems therein) and perform operations for providing access to the stored data and/or instructions. In some embodiments, memory 104 includes volatile memory circuits such as dynamic random access memory (DRAM), static random access memory (SRAM), and/or other types of memory that are used for storing the instructions and data, as well as mechanisms for controlling the memory circuits and accessing data and instructions in the memory circuits. In some embodiments, memory 104 includes or is part of a memory hierarchy with one or more caches and a main memory. In some of these embodiments, one or more of the caches in the hierarchy are located in SOC 102 (and not, that is, in memory 104), such as processing subsystem 114 or graphics processing subsystem 116.

In some embodiments, memory 104 is coupled to one or more non-volatile high-capacity mass-storage devices (not shown). For example, memory 104 can be coupled to a magnetic or optical disk drive, a solid-state drive, or another type of mass-storage device. In these embodiments, memory 104 can be used by electronic device 100 as fast-access storage for more frequently/recently used data, while the mass-storage device is used to store less frequently/recently used data.

Display 106 in electronic device 100 is a hardware functional block that performs operations for displaying information on a display screen that is coupled to electronic device 100 (or other output of electronic device 100, such as a haptic output, etc.). In some embodiments, display 106 and the corresponding display screen are incorporated into electronic device 100, such as with a display for a laptop or smart phone. In some embodiments, display 106 and the corresponding display screen are separate from, but communicatively coupled to electronic device 100, such as with a desktop monitor or television display. Along with the display screen, display 106 includes circuit elements for storing, processing, and displaying images (still images, streams of images, etc.) on the display screen. In some embodiments, display 106 supports the static display mode, in which display 106 periodically receives information for display from display subsystem 120, stores the information, and repeatedly displays the same stored information (e.g., image or images) until receiving subsequent information for display from display subsystem 120.

Voltage sources 108-110 in electronic device 100 are hardware functional blocks that include circuit elements for providing a supply voltage to other functional blocks in SOC 102. Generally, a supply voltage is an electrical signal that is supplied to one or more circuit elements to be used to enable the circuit elements to operate. The supply voltage is typically supplied at a substantially steady voltage, but with a current that varies as an electrical demand of the dependent circuits varies, e.g., with transient loads on the circuits. For example, one or both of voltage sources 108-110 may be voltage regulators, which are circuits that provide a supply voltage at substantially steady voltages, but with currents that vary based on the demand of the dependent circuits. By "substantially steady" voltages, it is meant that a supply voltage is, to the extent possible, sustained at or near a configured/given voltage, but that the voltage may vary in certain situations, such as when a transient load occurs on dependent circuits, etc.

Two voltage sources are shown in FIG. 1 to illustrate that electronic device 100, i.e., voltage sources 108-110, can provide two different supply voltages to the functional blocks in electronic device 100. For example, voltage source 108 may provide a "normal," "nominal," or "full" voltage such as 1.2 V or another voltage, and voltage source 110 may provide a "minimum" or "reduced" voltage such as 0.7 V or another voltage. Although two voltage sources are shown, any number of voltage sources may be present in electronic device 100. Generally, electronic device 100 includes sufficient voltage sources to enable the operations herein described.

Controller 112 is a hardware functional block that performs operations for managing the supply voltage, and possibly other operating parameters such as frequency, temperature, etc., for some or all of the functional blocks in electronic device 100. In some embodiments, controller 112 is, or is included in, a power controller, a system management controller, or another functional block. The operations performed by controller 112 are described below.

In some embodiments, communication paths (that include one or more buses, wires, guides, and/or connections) are coupled between the functional blocks in electronic device 100 (e.g., processing subsystem 114, fabric subsystem 124, memory 104, etc.), as shown by arrow-headed lines between the elements. The communication paths are used to transmit commands, data, and/or other information between the elements.

Although certain functional blocks, components, and elements are shown in electronic device 100 and SOC 102, in some embodiments, different functional blocks, components, and/or elements are included in electronic device 100 and/or SOC 102. For example, SOC 102 may include one or more additional processing subsystems 114, graphics processing subsystems 116, etc. In addition, one or more of the illustrated subsystems may not be included in SOC 102, or some or all of the one or more of the subsystem's functions may be incorporated into the other subsystems.

Although electronic device 100 is simplified for illustrative purposes, in some embodiments, electronic device 100 includes additional or different subsystems, functional blocks, circuit elements, and/or communication paths. For example, electronic device 100 may include power subsystems, etc. Generally, electronic device 100 includes sufficient subsystems, functional blocks, circuit elements, and/or communication paths to perform the operations herein described.

Electronic device 100 can be, or can be included in, any device that performs computational operations. For example, electronic device 100 can be, or can be included in, a desktop computer, a laptop computer, a wearable computing device, a tablet computer, a piece of virtual or augmented reality equipment, a smart phone, an artificial intelligence (AI) device, a server, a network appliance, a toy, a piece of audio-visual equipment, a home appliance, a vehicle, etc., and/or combinations thereof Islands In the described embodiments, functional blocks in electronic device 100 are logically grouped into two or more islands, with each island of the two or more islands including at least one of the functional blocks. The islands are used for controlling, for the corresponding functional blocks, operating parameters such as supply voltages, clock frequencies, temperatures, workloads, etc. As used herein, therefore, "logically grouped" means considered as a group for the purpose of controlling operating parameters—other relationships, such as physical proximity, interaction, communication, etc. between the functional blocks in a given island, while they may exist, are not required to.

In the following paragraphs, supply voltage is used as an example of an operating parameter that is controlled for functional blocks in islands in the described embodiments. As described herein, however, supply voltage is only one example of an operating parameter—other operating parameters may be similarly controlled and/or controlled in combination with supply voltage. For example, a clock frequency may be configured for functional blocks in an island along with the supply voltage. As another example, a cooling system such as fans or liquid cooling may be configured for functional blocks in an island along with supply voltage. As another example, work or task queue length, bandwidth allowance, or task type may be configured for functional blocks in an island.

Figure 2:
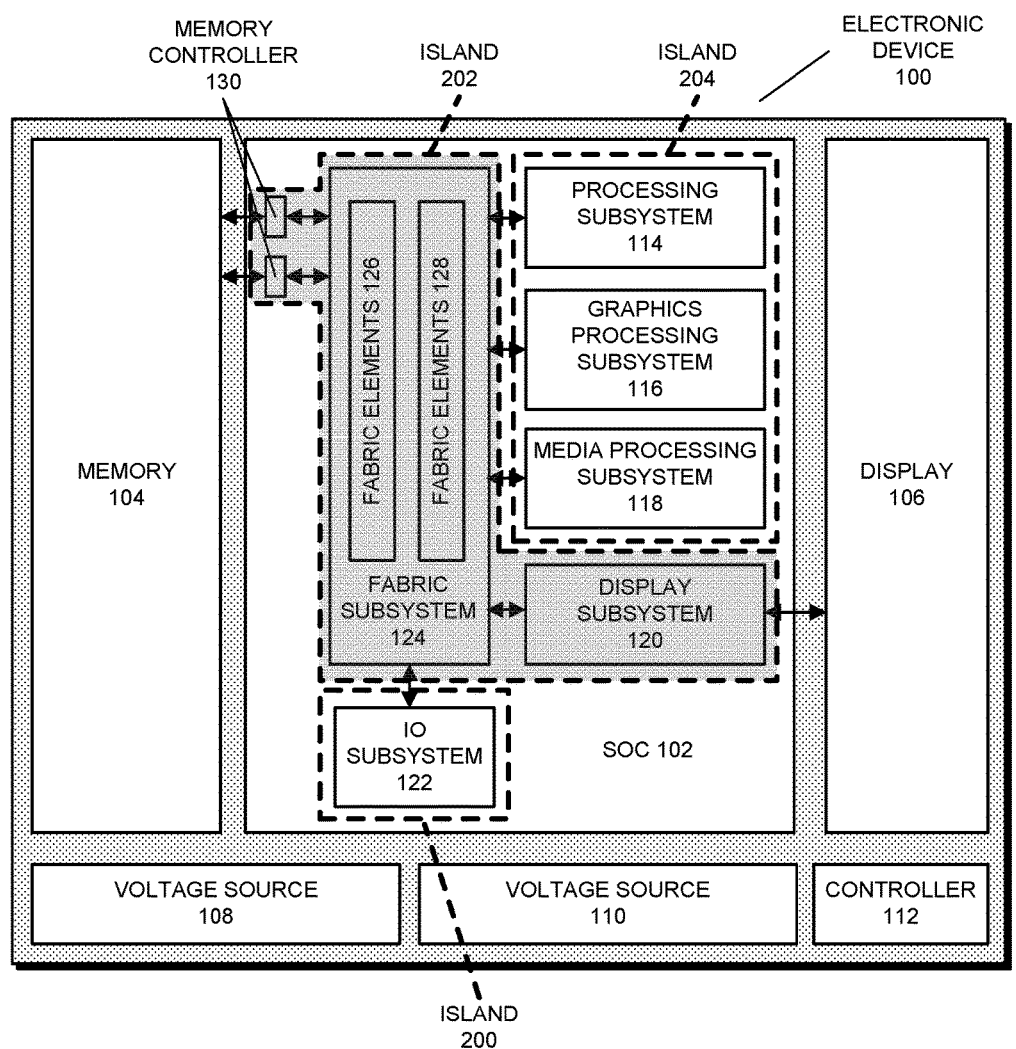
FIG. 2 presents a block diagram illustrating islands in an electronic device in accordance with some embodiments.

FIG. 2 presents a block diagram illustrating islands in an electronic device in accordance with some embodiments. As can be seen in FIG. 2, island 200 includes IO subsystem 122; island 202 (which is shaded for easier visibility of the islands in FIG. 2) includes display subsystem 120, fabric subsystem 124, and memory controller 130; and island 204 includes processing subsystem 114, graphics processing subsystem 116, and media processing subsystem 118. Controller 112 (and/or another functional block in electronic device 100) is configured to cause electronic device 100, e.g., voltage sources 108 and 110, to provide the same supply voltage to all of the functional blocks in each of the islands. Different islands, and hence the functional blocks therein, may therefore be provided with different supply voltages. In addition, controller 112 and/or another functional block in electronic device 100 may dynamically change the supply voltages provided to each island as electronic device 100 operates. For example, as an activity such as a type of application software being executed in electronic device 100, type of data being processed by electronic device 100, etc., changes, controller 112 may make corresponding adjustments to the supply voltages provided to some or all of the islands.

Figure 3:
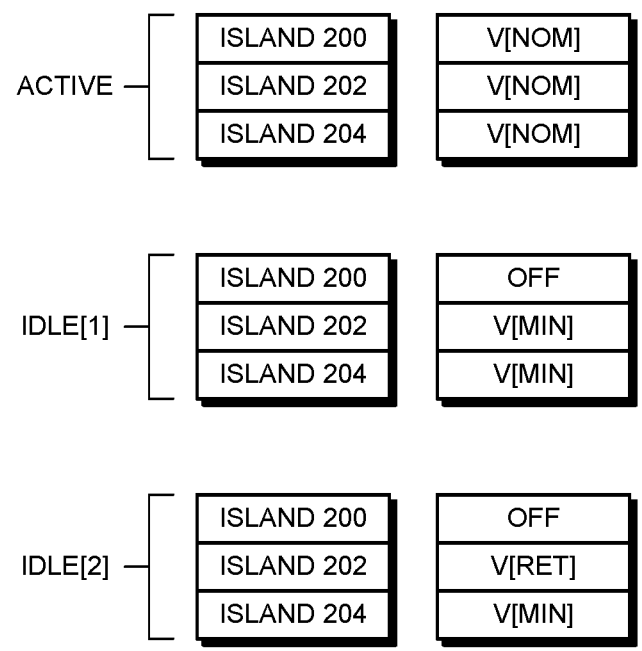
FIG. 3 presents a block diagram illustrating a scenario in which various supply voltages are provided to functional blocks in islands in an electronic device in accordance with some embodiments.

FIG. 3 presents a block diagram illustrating a scenario in which various supply voltages are provided to functional blocks in islands 200-204 in accordance with some embodiments. As can be seen in FIG. 3, the scenario includes an "active" state, in which the functional blocks in islands 200-204 are each supplied with a nominal voltage ("V[NOM]"), which can be a full power voltage (e.g., 1.2 V, etc.), at which the functional blocks in the islands are able to perform typical operations. The active state may be associated with normal operation, in which electronic device 100 appears to a user to be powered up and responds to inputs.

The scenario in FIG. 3 also includes an idle[1] state, in which functional blocks in island 200 are in an "off" state and are not provided with a supply voltage (e.g., 0 V). In the idle[1] state, functional blocks in islands 202-204 are provided with a supply voltage at or above a threshold voltage (e.g., 0.7 V), which is lower than the nominal voltage. At the voltage at or above a threshold voltage, memory circuit elements are able to retain stored information and other circuit elements are functional, but the functional blocks may react more slowly—possibly due to a corresponding reduction in clock frequency—than in the active state. The idle[1] state may be associated with low power operations such as low-power multimedia playback, network packet monitoring, etc., or may be an idle state to which electronic device 100 transitions under certain conditions (e.g., no user interaction for a given time, etc.). In the idle[1] state, electronic device 100 may appear to a user to be in a low power state (e.g., display screen turned off, certain functions disabled or performed slowly, some input mechanisms not operable, etc.), but may respond to some inputs, such as media playback commands, etc., depending on the properties of the particular low power state.

The scenario in FIG. 3 further includes an idle[2] state in which functional blocks in island 200 are in an "off" state and are not provided with a supply voltage (e.g., 0 V). In the idle[2] state, the functional blocks in island 202 are provided with a supply voltage at a sub-Vmin voltage (e.g., 0.3 V, 0.2 V, or another value). As described above, the sub-Vmin voltage is sufficiently low that circuit elements that have not been designed to operate at the sub-Vmin voltage will not operate reliably. For example, at the sub-Vmin voltage, unprepared circuit elements may be unable to retain stored information and/or may return incorrect results for computational operations, thus not "operating reliably." In the case of the functional blocks in island 202, at least some of the circuits are designed to operate at the sub-Vmin voltage, including logic memory circuits such as flops and latches and general logic circuits, but not including memory circuits such as SRAMs, etc. The functional blocks in island 202, despite being at the sub-Vmin voltage, may therefore retain operating state, may respond to certain inputs (perhaps more slowly than in the active state), and may still perform some operations of the functional blocks, such as monitoring for events, handling communications, etc. In the idle[2] state, island 204 is provided with a supply voltage at or above the threshold voltage, which enables the functional blocks in island 204 to retain state and perform at least some operations, as described above. The idle[2] state may be associated with lower power operations such as a static display mode or a background operation such as a file transfer mode, or may be an idle/lower power state. In the idle[2] state, electronic device 100 may appear to a user to be in a low power state (e.g., display screen turned off, certain functions disabled, etc.). In the static display mode, however, a display screen of electronic device 100 may be enabled (with or without a backlight lit) and may display the same static screen, such as a splash screen, or the same repeated sequence of screen images, such as a multi-image screen saver.

In some embodiments, functional blocks are assigned to islands based on the operating parameters, such as supply voltage, current, temperature, bandwidth, etc., that are to be provided to the functional blocks. For example, in some embodiments, functional blocks are assigned to islands (or not assigned to islands) based on whether the functional blocks are operable at the sub-Vmin voltage. In these embodiments, at least one of the islands includes only functional blocks for which circuit elements are designed to operate at the sub-Vmin voltage.

In some embodiments, information about which functional blocks are to be grouped in particular islands, how many islands there are, what operating parameters are to be used for islands, and other information relating to islands and configuration thereof, is received from an external source. In other words, controller 112 may receive information relating to islands and configuration thereof in the form of one or more configuration files, messages, packets, etc., from a functional block in electronic device 100, from a system administrator, from an operating system or software application executing on electronic device 100, and/or from another external source. In some embodiments, the information is dynamically updateable, such as when a configuration file is updated in memory at runtime (i.e., as electronic device 100 operates).

Although an embodiment in which islands 200-204 are used is presented in FIG. 2, not all embodiments are required to use the same arrangement of islands, nor are the illustrated functional blocks indicative of where island boundaries may be located. For example, in some embodiments, fabric elements 126 and 128 in fabric subsystem 124 are in different islands. This may happen where different portions of the fabric are handled differently with regard to low power states—such as when only portions of the fabric need to be enabled to carry out particular operations. Generally, in the described embodiments, any one or more functional blocks may be logically grouped into each island and there is no restriction on the number of islands that may be used.

The configurations of voltages shown in FIG. 3 are shown only as examples and are not the only configurations of voltages that can be used in the described embodiments. In addition, the active, idle[1], and idle[2] states may be associated with other or additional operating parameters for the islands, such as clock frequency, current, temperature, workload, queue length, etc., and different arrangements of states may be used.

Process for using Islands to Configure Operating Parameters

Figure 4:
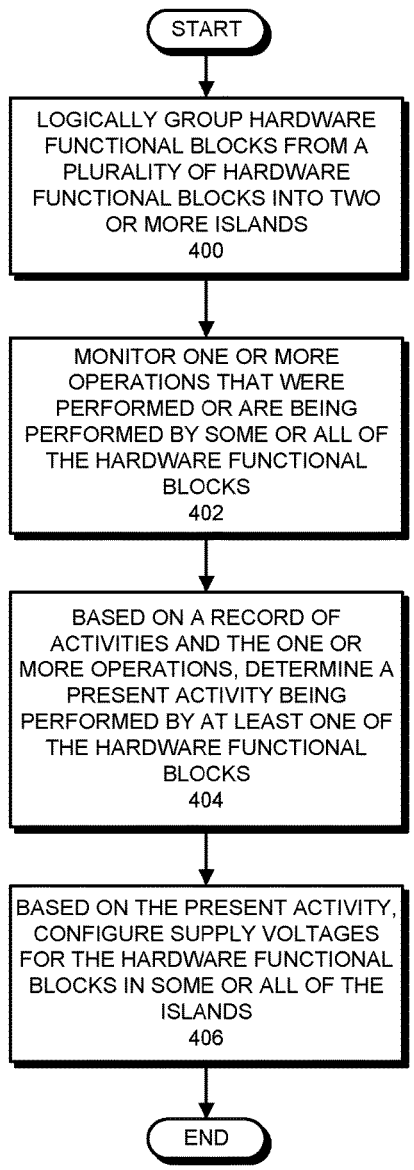
FIG. 4 presents a flowchart illustrating a process for configuring supply voltages for functional blocks in islands in an electronic device in accordance with some embodiments.

The described embodiments use islands to configure operating parameters such as supply voltages for functional blocks in electronic device 100. FIG. 4 presents a flowchart illustrating a process for configuring the supply voltages (i.e., the operating parameters) for functional blocks in islands in accordance with some embodiments. Note that the operations shown in FIG. 4 are presented as a general example of operations performed by some embodiments. The operations performed by other embodiments include different operations and/or operations that are performed in a different order. Additionally, although certain mechanisms are used in describing the process (e.g., controller 112, etc.), in some embodiments, other mechanisms can perform the operations.

For the embodiment shown in FIG. 4, the islands in FIG. 2 are used. In other words, three islands, islands 200-204, are used for the operations in FIG. 4. In other embodiments, different numbers of islands and/or islands that include different arrangements of hardware functional blocks are used. In addition, for the example in FIG. 4, supply voltage is used as an example of an operating parameter that is controlled for functional blocks in islands in the described embodiments. Supply voltage, however, is only one example of an operating parameter—other operating parameters may be similarly controlled and/or controlled in combination with supply voltage.

The process shown in FIG. 4 starts when controller 112 logically groups hardware functional blocks from a plurality of hardware functional blocks into two or more islands (step 400). During this operation, the functional blocks are grouped into the two islands based on one or more properties of the functional blocks, such as whether the functional blocks are operable with specified operating parameters (e.g., voltages, currents, temperatures, operation type, etc.), whether the functional blocks execute portions of a shared workload, whether the functional blocks are likely to interact with one another, etc. After step 400 is complete, controller 112 has identified each island and the hardware functional blocks logically grouped therein.

In some embodiments, controller 112 receives, from an external source (e.g., a system administrator, an operating system, another functional block in electronic device 100, etc.) an identification of the functional blocks that are to be grouped. For example, controller 112 may read a file, access one or more registers, etc. that were updated by the external source. In other embodiments, controller 112 polls or otherwise acquires relevant information (e.g., configuration information, version information, operating parameter limits, supported operation types, etc.) from the hardware functional blocks and then determines the logical grouping based on the information acquired from the hardware functional blocks.

Controller 112 then monitors one or more operations that were performed or are being performed by some or all of the hardware functional blocks (step 402). For this operation, controller 112 monitors operations that are being performed by the hardware functional blocks for a given amount of time, e.g., 20 milliseconds, 2 seconds, and/or another amount of time—or simply for the current instant in time. In other words, for the given amount of time, controller 112 monitors, using one or more performance counters, instruction identifiers, workload profiles, instruction memory addresses, etc., the amount and/or characteristics of operations being performed by the monitored hardware functional blocks. For example, controller 112 may snoop a system bus to observe memory accesses being made by processing subsystem 114 to determine various properties of the memory access operations, such as total number of memory accesses, addresses being accessed, access rate increase/decrease, read/write ratio, accessed data types, etc. As another example, controller 112 can identify software application(s) being executed by electronic device 100 (i.e., by hardware functional blocks such as processing subsystem 114, graphics processing subsystem 116, etc.) and, based on records associated with the software application(s), can determine amounts or types of operations being performed.

Based on a record of activities and the one or more operations, controller 112 determines a present activity being performed by the at least one hardware functional block (step 404). During this operation, controller 112 compares the operations being performed to one or more records of activities associated with operations being performed and determines, based on the comparison, the present activity being performed. For example, based on a record that associates the number or type of memory accesses being performed by processing subsystem 114 with present activities for processing subsystem 114, controller 112 can determine the present activity being performed by processing subsystem 114. In this case, controller 112 can determine, for instance, that processing subsystem 114 is in a read-dominated phase of memory accesses and thus is more likely to be in a computationally-intense present activity. As another example, controller 112 can determine that a given functional block is likely to be idle (i.e., the present "activity" is idleness), such as when display subsystem 120 is in the above-described static display mode. As another example, based on an identifier for a software application being executed by the at least one hardware functional block, controller 112 can determine the present activity.

Based on the present activity, controller 112 configures supply voltages for the hardware functional blocks in some or all of the islands (step 406). For this operation, controller 112 configures the supply voltages in accordance with the present activity of the monitored hardware functional blocks. For example, controller 112 may reduce the supply voltage (and possibly other operational parameters, such as clock frequency, etc.) for islands in which functional blocks are to be idle, and may increase the supply voltage (and possibly other operational parameters) for islands in which functional blocks are to be at least partially active.

Figure 5:
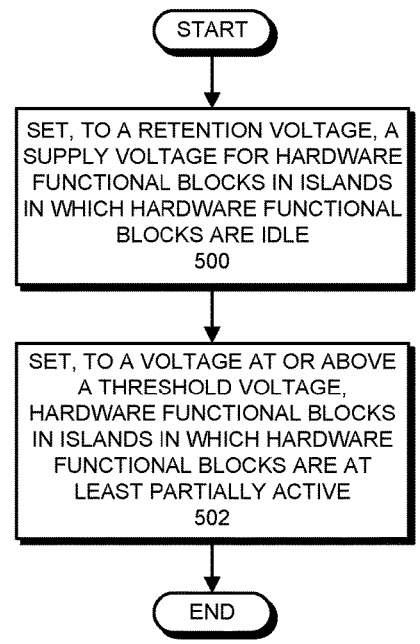
FIG. 5 presents a flowchart illustrating a process for configuring supply voltages for functional blocks in accordance with some embodiments.

FIG. 5 presents a flowchart illustrating a process for configuring supply voltages for hardware functional blocks in accordance with some embodiments. The operations shown in FIG. 5, although not restricted to a particular operating mode, may be performed when electronic device 100 is in the static display mode. Note that the operations shown in FIG. 5 are presented as a general example of operations performed by some embodiments. The operations performed by other embodiments include different operations and/or operations that are performed in a different order. Additionally, although certain mechanisms are used in describing the process (e.g., controller 112, etc.), in some embodiments, other mechanisms can perform the operations.

The process shown in FIG. 5 starts when controller 112 sets, to a sub-Vmin voltage, a supply voltage for hardware functional blocks in islands in which hardware functional blocks are idle (step 500). During this operation, for example, controller 112 may couple a supply voltage input for the hardware functional blocks to voltage source 108, which is, for this example, assumed to provide the sub-Vmin voltage. Depending on the configuration of electronic device 100 and the hardware functional blocks, this can involve switching switches, reconfiguring circuits, etc. to couple voltage source 108 to the hardware functional blocks. Alternatively, the hardware functional blocks may remain coupled to a given voltage source, such as voltage source 108, but the voltage source may be adjusted so that the voltage source provides the sub-Vmin voltage. By causing the sub-Vmin voltage to be provided to the functional blocks as described, controller 112 ensures that the hardware functional blocks in the island—which are designed to be operable at the sub-Vmin voltage—retain operating state and are at least minimally functional, but are otherwise transitioned to a low-power state in which electrical power is conserved, less heat is generated, etc.

Controller 112 then sets, to a voltage at or above a threshold voltage, hardware functional blocks in islands in which hardware functional blocks are at least partially active (step 502). Similarly to step 500, controller 112 may couple a supply voltage input for the hardware functional blocks to a corresponding voltage source 110 that provides the voltage at or above the threshold voltage. Alternatively, the hardware functional blocks may remain coupled to a given voltage source, such as voltage source 110, but the voltage source may be adjusted so that the voltage source provides the voltage above the threshold voltage. By causing the voltage above the threshold voltage to be provided to the functional blocks as described, controller 112 ensures that the hardware functional blocks in the island—which may not be designed to operate at the sub-Vmin voltage—remain functional. The precise "voltage above the threshold voltage" described for step 502 depends on the circuit elements in the hardware functional blocks, i.e., depends on what voltage the circuit elements need to function as described. For example, the voltage above the threshold voltage may be 0.7 V, 1 V, or another voltage value.

Although FIG. 5 is described using two supply voltages, in some embodiments, different arrangements of supply voltages are used. For example, consider the idle[1] state in FIG. 3, in which island 200 is provided 0 V, i.e., is in an "off" state. Generally, and based on the properties of the functional blocks and the present activity, the described embodiments provide corresponding supply voltages to all of the functional blocks in each of the islands.

In some embodiments, a computing device (e.g., electronic device 100, and/or some portion thereof) uses code and/or data stored on a non-transitory computer-readable storage medium to perform some or all of the operations herein described. More specifically, the computing device reads the code and/or data from the computer-readable storage medium and executes the code and/or uses the data when performing the described operations. A computer-readable storage medium can be any device, medium, or combination thereof that stores code and/or data for use by a computing device. For example, the computer-readable storage medium can include, but is not limited to, volatile memory or non-volatile memory, including flash memory, random access memory (eDRAM, RAM, SRAM, DRAM, DDR, DDR2/DDR3/DDR4 SDRAM, etc.), read-only memory (ROM), and/or magnetic or optical storage mediums (e.g., disk drives, magnetic tape, CDs, DVDs).

In some embodiments, one or more hardware modules are configured to perform the operations herein described. For example, the hardware modules can include, but are not limited to, one or more processors/cores/central processing units (CPUs), application-specific integrated circuit (ASIC) chips, field-programmable gate arrays (FPGAs), compute units, embedded processors, graphics processors (GPUs)/graphics cores, pipelines, Accelerated Processing Units (APUs), system management units, power controllers, and/or other programmable-logic devices. When such hardware modules are activated, the hardware modules perform some or all of the operations. In some embodiments, the hardware modules include one or more general-purpose circuits that are configured by executing instructions (program code, firmware, etc.) to perform the operations.

In some embodiments, a data structure representative of some or all of the structures and mechanisms described herein (e.g., SOC 102, controller 112, and/or some portion thereof) is stored on a non-transitory computer-readable storage medium that includes a database or other data structure which can be read by a computing device and used, directly or indirectly, to fabricate hardware including the structures and mechanisms. For example, the data structure may be a behavioral-level description or register-transfer level (RTL) description of the hardware functionality in a high level design language (HDL) such as Verilog or VHDL. The description may be read by a synthesis tool which may synthesize the description to produce a netlist including a list of gates/circuit elements from a synthesis library that represent the functionality of the hardware including the above-described structures and mechanisms. The netlist may then be placed and routed to produce a data set describing geometric shapes to be applied to masks. The masks may then be used in various semiconductor fabrication steps to produce a semiconductor circuit or circuits corresponding to the above-described structures and mechanisms. Alternatively, the database on the computer accessible storage medium may be the netlist (with or without the synthesis library) or the data set, as desired, or Graphic Data System (GDS) II data.

In this description, variables or unspecified values (i.e., general descriptions of values without particular instances of the values) are represented by letters such as N. As used herein, despite possibly using similar letters in different locations in this description, the variables and unspecified values in each case are not necessarily the same, i.e., there may be different variable amounts and values intended for some or all of the general variables and unspecified values. In other words, N and any other letters used to represent variables and unspecified values in this description are not necessarily related to one another.

The foregoing descriptions of embodiments have been presented only for purposes of illustration and description. They are not intended to be exhaustive or to limit the embodiments to the forms disclosed. Accordingly, many modifications and variations will be apparent to practitioners skilled in the art. Additionally, the above disclosure is not intended to limit the embodiments.

The scope of the embodiments is defined by the appended claims.

What is claimed is:

1. An electronic device, comprising:
a plurality of hardware functional blocks, the hardware functional blocks being logically grouped into two or more islands, with each island including a different one or more of the hardware functional blocks, wherein the hardware functional blocks that are logically grouped into at least one of the islands include hardware functional blocks that are operable at a sub-Vmin voltage and the hardware functional blocks that are logically grouped into at least one other of the islands include hardware functional blocks that are not reliably operable at the sub-Vmin voltage, wherein the sub-Vmin voltage is a voltage that is sufficiently low that only circuits having circuit elements designed to be operable at the sub-Vmin voltage operate reliably;
a hardware controller that is configured to:
determine a present activity being performed by at least one of the hardware functional blocks; and
based on the present activity, configure supply voltages for the hardware functional blocks in some or all of the islands.

2. The electronic device of claim 1, wherein the present activity is an activity for which hardware functional blocks in at least one of the islands are idle and hardware functional blocks in others of the islands are at least partially active, and
wherein configuring the supply voltage for the hardware functional blocks in some or all of the islands comprises:
setting, to a sub-Vmin voltage, the supply voltage for hardware functional blocks in the at least one of the islands in which hardware functional blocks are idle, the sub-Vmin voltage being a voltage that is sufficiently low that only circuits having circuit elements designed to be operable at the sub-Vmin voltage operate reliably.

3. The electronic device of claim 2, wherein logic circuits have the circuit elements designed to be operable at the sub-Vmin voltage and memory circuits do not have the circuit elements designed to be operable at the sub-Vmin voltage.

4. The electronic device of claim 2, wherein configuring the supply voltage for the hardware functional blocks in some or all of the islands further comprises:
setting, to a voltage above a threshold voltage, the supply voltage for hardware functional blocks in the others of the islands in which hardware functional blocks are at least partially active, the threshold voltage being a voltage that is sufficiently high to enable circuits without the circuit elements designed to be operable at the sub-Vmin voltage to operate reliably.

5. The electronic device of claim 2, wherein the present activity is a static display activity for which a substantially static image is displayed on a display of the electronic device, wherein, for the static display activity:
hardware functional blocks in an island that includes hardware functional blocks performing operations for displaying the static image are at least partially active; and
hardware functional blocks in an island that includes hardware functional blocks performing operations for a communication fabric are idle.

6. The electronic device of claim 1, wherein the hardware controller is further configured to:
acquire, from an external source, an identification of the circuit elements included in each island; and
configure the supply voltages based at least in part on the identification.

7. The electronic device of claim 1, wherein determining the present activity being performed by the at least one of the hardware functional blocks comprises:
monitoring one or more operations that were performed, are being performed, or are predicted to be performed by some or all of the hardware functional blocks; and
based on a record of activities and the one or more operations, determining the present activity being performed by the at least one of the hardware functional blocks.

8. A method of operating an electronic device that comprises a plurality of hardware functional blocks and a hardware controller, the method comprising:
logically grouping, by the hardware controller, the plurality of hardware functional blocks into two or more islands, each island including a different one or more of the hardware functional blocks, wherein the hardware functional blocks that are logically grouped into at least one of the islands include hardware functional blocks that are operable at a sub-Vmin voltage and the hardware functional blocks that are logically grouped into at least one other of the islands include hardware functional blocks that are not reliably operable at the sub-Vmin voltage, wherein the sub-Vmin voltage is a voltage that is sufficiently low that only circuits having circuit elements designed to be operable at the sub-Vmin voltage operate reliably;
determining, by the hardware controller, a present activity being performed by at least one of the hardware functional blocks; and
based on the present activity, configuring, by the hardware controller, supply voltages for the hardware functional blocks in some or all of the islands.

9. The method of claim 8, wherein the present activity is an activity for which hardware functional blocks in at least one of the islands are idle and hardware functional blocks in others of the islands are at least partially active, and
wherein the method further comprises, when configuring the supply voltage for the hardware functional blocks in some or all of the islands:
setting, to a sub-Vmin voltage by the hardware controller, the supply voltage for hardware functional blocks in the at least one of the islands in which hardware functional blocks are idle, the sub-Vmin voltage being a voltage that is sufficiently low that only circuits having circuit elements designed to be operable at the sub-Vmin voltage operate reliably.

10. The method of claim 9, wherein logic circuits have the circuit elements designed to be operable at the sub-Vmin voltage and memory circuits do not have the circuit elements designed to be operable at the sub-Vmin voltage.

11. The method of claim 9, wherein the method further comprises, when configuring the supply voltage for the hardware functional blocks in some or all of the islands:
    setting, to a voltage above a threshold voltage by the hardware controller, the supply voltage for hardware functional blocks in the others of the islands in which hardware functional blocks are at least partially active, the threshold voltage being a voltage that is sufficiently high to enable circuits without the circuit elements designed to be operable at the sub-Vmin voltage to operate reliably.

12. The method of claim 9, wherein the present activity is a static display activity for which a substantially static image is displayed on a display of the electronic device, wherein, for the static display activity:
    hardware functional blocks in an island that includes hardware functional blocks performing operations for displaying the static image are at least partially active; and
    hardware functional blocks in an island that includes hardware functional blocks performing operations for a communication fabric are idle.

13. The method of claim 8, further comprising:
    acquiring, by the hardware controller, from an external source, an identification of the circuit elements included in each island; and
    configuring, by the hardware controller, the supply voltages based at least in part on the identification.

14. The method of claim 8, further comprising, when determining the present activity being performed by the at least one of the hardware functional blocks:
    monitoring, by the hardware controller, one or more operations that were performed, are being performed, or are predicted to be performed by some or all of the hardware functional blocks; and
    based on a record of activities and the one or more operations, determining, by the hardware controller, the present activity being performed by the at least one of the hardware functional blocks.

* * * * *